(12) United States Patent
Fay et al.

(10) Patent No.: US 8,592,859 B2
(45) Date of Patent: Nov. 26, 2013

(54) METHODS AND APPARATUS FOR ANTIMONIDE-BASED BACKWARD DIODE MILLIMETER-WAVE DETECTORS

(75) Inventors: Patrick Fay, Granger, IN (US); Ning Su, Fishkill, NY (US)

(73) Assignee: University of Notre Dame du Lac, Notre Dame, IN (US)

( * ) Notice: Subject to any disclaimer, the term of this patent is extended or adjusted under 35 U.S.C. 154(b) by 127 days.

(21) Appl. No.: 12/993,974

(22) PCT Filed: May 27, 2009

(86) PCT No.: PCT/US2009/045288
§ 371 (c)(1),
(2), (4) Date: Apr. 13, 2011

(87) PCT Pub. No.: WO2010/016966
PCT Pub. Date: Feb. 11, 2010

(65) Prior Publication Data
US 2011/0186906 A1   Aug. 4, 2011

Related U.S. Application Data

(60) Provisional application No. 61/056,278, filed on May 27, 2008.

(51) Int. Cl.
  *H01L 29/88* (2006.01)
(52) U.S. Cl.
  USPC .............. 257/106; 257/656; 257/E29.332; 257/E29.336

(58) Field of Classification Search
  USPC .................. 257/106, 656, E29.332, E29.336
  See application file for complete search history.

(56) References Cited

U.S. PATENT DOCUMENTS

| | | | |
|---|---|---|---|
| 6,242,762 B1 * | 6/2001 | Brown et al. | 257/104 |
| 6,774,389 B2 | 8/2004 | Hanamaki | |
| 7,170,105 B1 | 1/2007 | Schulman et al. | |
| 7,361,943 B2 * | 4/2008 | Berger et al. | 257/106 |
| 2010/0301217 A1 * | 12/2010 | Sertel et al. | 250/338.4 |
| 2011/0186906 A1 * | 8/2011 | Fay et al. | 257/106 |
| 2012/0299057 A1 * | 11/2012 | Takahashi | 257/183 |

OTHER PUBLICATIONS

Deelman et al., "Sb-Heterostructure Millimeter-Wave Detectors With Rreduced Capacitance and Noise Equivalent Power", IEEE Electron Dev. Lett., vol. 29, No. 6, Jun. 2008, pp. 536-539.*
International Search Report: PCT/US09/45288.
State Intellectual Property Office of P.R. China, Office Action re Chinese Patent Application No. 200980119371.9, issued on Apr. 11, 2013, 16 pages.

* cited by examiner

*Primary Examiner* — George Fourson, III
(74) *Attorney, Agent, or Firm* — Greenberg Traurig, LLP

(57) ABSTRACT

Example methods and apparatus for Antimonide-based backward diode millimeter-wave detectors are disclosed. A disclosed example backward diode includes a cathode layer adjacent to a first side of a non-uniform doping profile, and an Antimonide tunnel barrier layer adjacent to a second side of the spacer layer.

6 Claims, 5 Drawing Sheets

METHODS AND APPARATUS FOR ANTIMONIDE-BASED BACKWARD DIODE MILLIMETER-WAVE DETECTORS

RELATED APPLICATION

This patent is an International Application claiming priority to U.S. Provisional Patent Application No. 61/056,278, entitled "Methods and Apparatus for Antimonide-Based Backward Diode Millimeter-Wave Detectors," filed on May 27, 2008, which is hereby incorporated by reference in its entirety.

GOVERNMENT INTEREST STATEMENT

This disclosure was made, in part, with United States government support from the National Science Foundation (NSF), grant No. ECS-0506950 and grant No. IIS-0610169. The United States government has certain rights in this invention.

FIELD OF THE DISCLOSURE

The present disclosure relates to low noise detectors, and in particular, to antimonide-based backward diode millimeter-wave detectors.

BACKGROUND OF RELATED ART

The unique propagation characteristics of millimeter-waves, including the ability to penetrate obstacles like fog, dust, fabric, and light building materials make them candidates for detection, imaging and remote sensing under adverse conditions. Unlike ionizing radiation emitted through the use of X-ray imaging systems, millimeter-waves engender fewer safety concerns around humans and animals. Additionally, because humans and animals emit a natural radiation that includes a portion of the millimeter-wave spectrum, imaging systems designed to detect such radiation may identify objects, such as, for example, weapons and/or contraband hidden underneath clothing when such objects block the naturally emitted radiation. At least one benefit realized by detecting naturally-emitted (e.g., human) millimeter-wave radiation is that detection systems do not need to employ a radiation source/emitter when scanning for objects.

Low-level high-frequency millimeter-wave signals may also facilitate improvements in fields of communication, imaging, medial diagnostics, avionics, and/or radiometry. In some fields of interest, relatively high standards of repeatability and resolution are necessary to accomplish one or more tasks, such as scientific and/or industrial radiometry applications. Some devices currently employed to detect millimeter-wave signals include Schottky diodes as direct square-law detectors. However, to achieve a sufficiently low junction resistance for high-efficiency impedance matching at millimeter-wave frequencies, Schottky diodes are typically biased and/or implemented in conjunction with one or more amplifiers in an effort to minimize detection noise. In some instances that demand a low noise floor, multiple stages of pre-amplifiers are necessary, each currently having a cost in the thousands of dollars.

DETAILED DESCRIPTION

Figure 1:
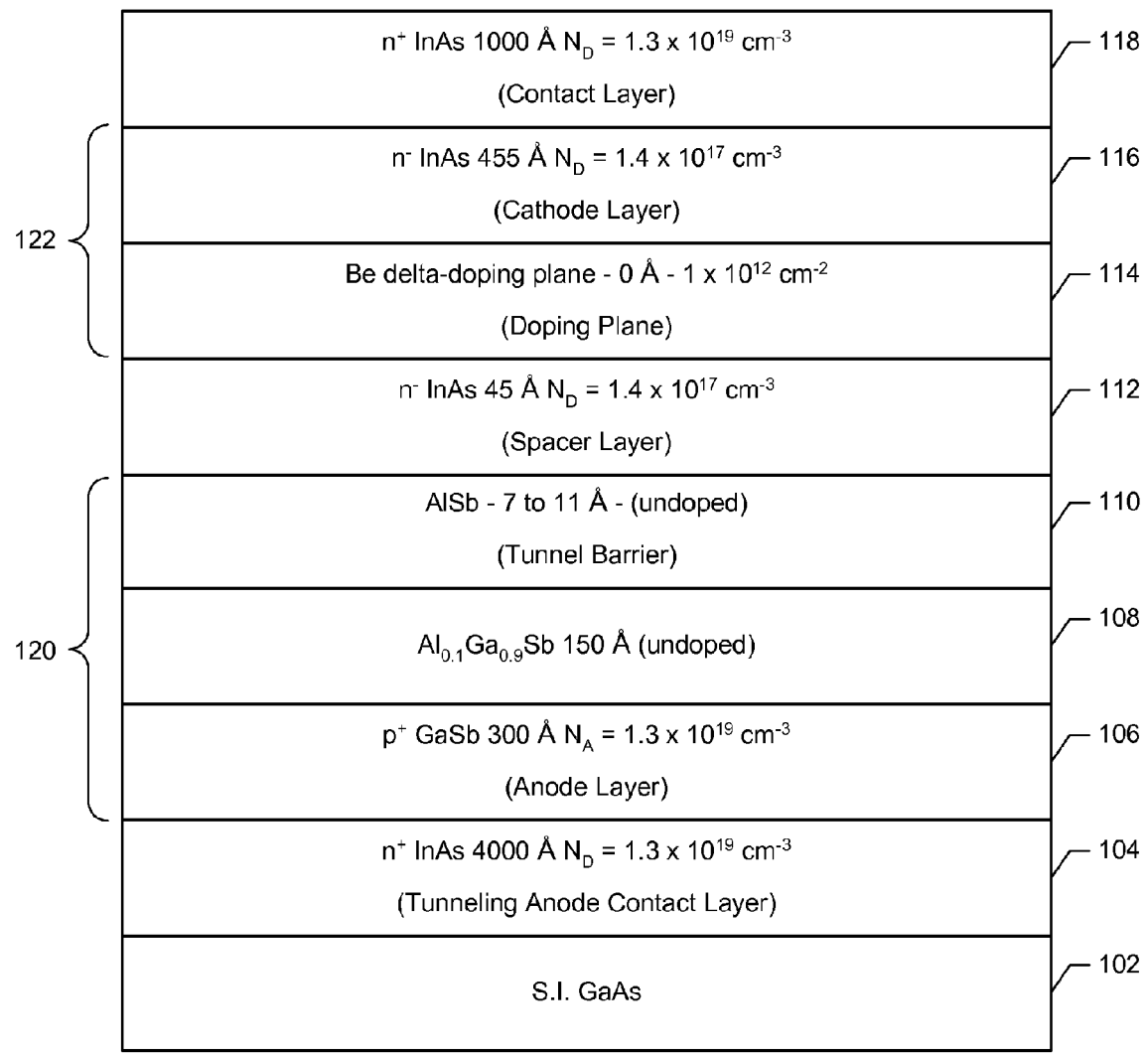
FIG. 1 is an example Antimonide-based non-uniform doping heterostructure layer.

Technologies for millimeter-wave detection have been explored in recent years for applications in navigation, avionics, security screening, and chemical sensing. Detection, imaging, and/or radiometry of millimeter-waves may be accomplished using devices made with Silicon (Si), Germanium (Ge), GaAs, or other semiconductor materials in an effort to provide low noise, high pixel density, high nonlinearity and/or curvature, and/or relatively fast frequency responses. For example, Schottky diodes have been employed for such detection purposes due to their low forward turn-on voltage, fast frequency response and high bandwidth. While some Schottky diode implementations include external biasing, which introduces flicker noise (e.g., 1/f noise), unbiased implementations of Schottky diodes still generally suffer from strong sensitivity changes with temperature and may have undesirably large junction resistances. Further, Schottky diode temperature dependence directly influences diode curvature.

$$\gamma = \frac{\partial^2 I/\partial V^2}{\partial I/\partial V} \qquad \text{Equation 1}$$

$$\gamma \leq \frac{q}{kT} \qquad \text{Equation 2}$$

Example Equation 1 illustrates the curvature coefficient, $\gamma$, which is the quotient of the second derivative of current-to-voltage divided by the first derivative of current-to-voltage. The curvature coefficient ($\gamma$) serves as at least one industry-used metric to quantify detector nonlinearity (and hence sensitivity) at zero bias. However, as described above, Schottky diodes and/or other thermionic devices exhibit a fundamental performance limit as expressed in Equation 2, in which q is the electron charge, k is the Boltzmann constant, and T is the absolute temperature. Example Equation 2 is independent of device design, and results in a fundamental limit on Schottky diode curvature. Generally speaking, a device exhibiting relatively highly nonlinear current-voltage characteristics at zero bias translates to improved voltage sensitivity values for that device.

Ge-based backward tunnel diodes have also been studied in view of their zero bias nonlinearity. While zero bias devices simplify detector driver circuitry and minimize instances of added noise (e.g., flicker noise), Ge-based backward diodes exhibit significant manufacturing challenges that prevent cost judicious mass-producible devices having functional tolerances. Similar manufacturing challenges exist for GaAs-based planar-doped barrier diodes.

Example methods and apparatus described herein include InAs/AlSb/GaSb backward diodes employed for millimeter-wave square-law power detection. Also described herein is, in part, a heterostructure design with a low junction capacitance, a low junction resistance, and a high curvature coefficient as compared to previously known designs. The example heterostructure design described herein includes a voltage sensitivity, which is directly proportional to the curvature coefficient that is improved by, for example, approximately 31% as compared to prior reports of devices having similar barrier thicknesses. These devices rely on, in part, quantum mechanical tunneling as a basis of operation. As such, such devices are not subject to one or more curvature limitations, such as those expressed above in Equation 2. The junction capacitance is also reduced by, for example, approximately 25% (e.g., 9.5 fF/$\mu m^2$).

Improved sensitivity and decreased junction capacitance are realized, in part, by incorporation of a p-type $\delta$-doping plane with an example sheet concentration of $1 \times 10^{12}$ cm$^{-2}$ in an example n-InAs cathode layer. The combination of low resistance (and thus Johnson noise) and high sensitivity result in an estimated noise equivalent power (NEP) of 0.24 pW/Hz$^{1/2}$ at 94 GHz for an example conjugately-matched source, while the reduced capacitance facilitates wideband matching and increases the example detector cutoff frequency. These antimonide (Sb)-based backward diodes have promise with, for instance, improving the performance of passive millimeter-wave and submillimeter-wave imaging systems.

Direct detection of millimeter-waves with zero bias square-law detectors may be particularly attractive for passive imaging applications because of the reduced 1/f noise that results from the absence of an external bias. Compared to alternatives including, but not limited to Schottky diodes, Ge backward diodes and GaAs planar-doped barrier (PDB) diodes, example InAs/AlSb/GaSb detectors demonstrate superior performance, with high sensitivity, high cut-off frequency, low noise, and favorable temperature-dependence. While low barrier zero bias Schottky diode detectors with tunable barrier heights have been reported at high frequencies, such diodes exhibit strong sensitivity changes with temperature compared to Sb-based tunnel diodes, particularly because the curvature ($\gamma$) of Schottky diodes is typically limited to $\gamma \leq q/kT$, as described above. At room temperature (T=300 K), $\gamma \leq 38.5$ V$^{-1}$ for PDBs or Schottky diodes. On the other hand, the curvature of the example tunneling detectors described herein is not bounded by q/kT, and prior demonstrations have shown curvatures as high as 70 V$^{-1}$ for Ge-based devices. High curvature ($\gamma$), low capacitance, $C_j$, and modest junction resistance, $R_j$, are some example design factors to produce low noise detectors.

Reduction in $R_j$ for Sb-heterostructure detectors has been achieved, in part, by reducing the tunnel barrier thickness from 32 Å to approximately 7 Å. However, reducing the barrier thickness alone also resulted in a corresponding decrease in curvature coefficient from 39 to 32 V$^{-1}$. Described in further detail below are performance characteristics of thin-barrier Sb-based millimeter-wave detectors, in which some example heterostructure designs exhibit a measured curvature, $\gamma$, of 42.4 V$^{-1}$. Additionally, an example measured unmatched sensitivity, $\beta v$, of 4200 V/W is realized by the methods and apparatus described herein, which is consistent with expectations from $\beta_v = 2Z_s\gamma$. This example curvature exceeds the theoretical limits for Schottky detectors, and may be achieved while simultaneously reducing the junction capacitance, $C_j$. Improvements in sensitivity and capacitance may be obtained by tailoring the doping profile to include a p-type non-uniform (e.g., delta ($\delta$)-doping plane, ramp doping, pulse doping, etc.) in the heterostructure to optimize the charge carrier distribution within the example device(s). The example device design(s) increase the zero bias sensitivity and further lower the junction capacitance without significantly compromising the junction resistance. Such example characteristics are particularly applicable with, for instance, improving performance of low-noise millimeter-wave and sub-millimeter-wave detectors.

FIG. 1 illustrates an example device structure 100 grown by molecular beam epitaxy (MBE) on a semi-insulating GaAs substrate 102. Example metamorphic device layers are grown on a GaAs buffer, with a 4000 Å n$^+$InAs ($1.3 \times 10^{19}$ cm$^{-3}$) tunneling anode contact layer 104, a 300 Å p$^+$GaSb ($1.3 \times 10^{19}$ cm$^{-3}$) anode layer 106, a 150 Å undoped Al$_{0.1}$Ga$_{0.9}$Sb layer 108, a 7-11 Å undoped AlSb tunnel barrier 110, a 45 Å n-InAs spacer layer (doped $1.4 \times 10^{17}$ cm$^3$) 112, a Be $\delta$-doping plane ($1 \times 10^{12}$ cm$^{-2}$) 114, a 455 Å n-InAs ($1.4 \times 10^{17}$ cm$^{-3}$) cathode layer 116, and ending with an n$^+$InAs ($1.3 \times 10^{19}$ cm$^{-3}$) contact layer 118. The addition of the example fully-depleted p-type $\delta$-doping plane 114 in the n-InAs cathode layer 116 near the example AlSb barrier 110 adjusts the band bending near the tunnel barrier 110 to enhance the device performance. The example 45-Å spacer layer 112 separates the doping plane 114 from the tunnel barrier 110. Fabrication of example Sb-based backward diodes may be performed using, but not limited to mix-and-match electron-beam/optical lithography, contact metallization by evaporation and/or lift off, wet-chemical mesa etching, and/or benzocyclobutene dielectric passivation, and/or any other suitable fabrication method.

In the illustrated example of FIG. 1, the thicknesses for the device structure 100 are provided for example purposes and not limitation. In some examples, greater or lesser thicknesses may be employed for the GaAs substrate 102, the tunneling anode contact layer 104, the anode layer 106, the undoped AlGaSb layer 108, the tunnel barrier 110, the spacer layer 112, the cathode layer 116, and/or the contact layer 118. Furthermore, it should be appreciated that the layer thicknesses may have a range of values in keeping with the described examples. Additionally, doping concentrations for the aforementioned layers of the example device structure 100 are provided for example purposes only and not by way of limitation.

Generally speaking, the example tunnel barrier 110, the undoped AlGaSb layer 108, and the anode layer 106 are referred to as an Antimonide (Sb) substructure 120. Additionally, the example cathode layer 116, doping plane 114, and the spacer layer 112 are referred to as a cathode substructure 122. While the example doping plane 114 of FIG. 1 includes a Beryllium delta-doping plane, one or more alternate dopants may be employed. Moreover, one or more alternate non-uniform doping profiles may be employed including, but not limited to ramped doping profiles and/or pulsed doping profiles.

Figure 2A:
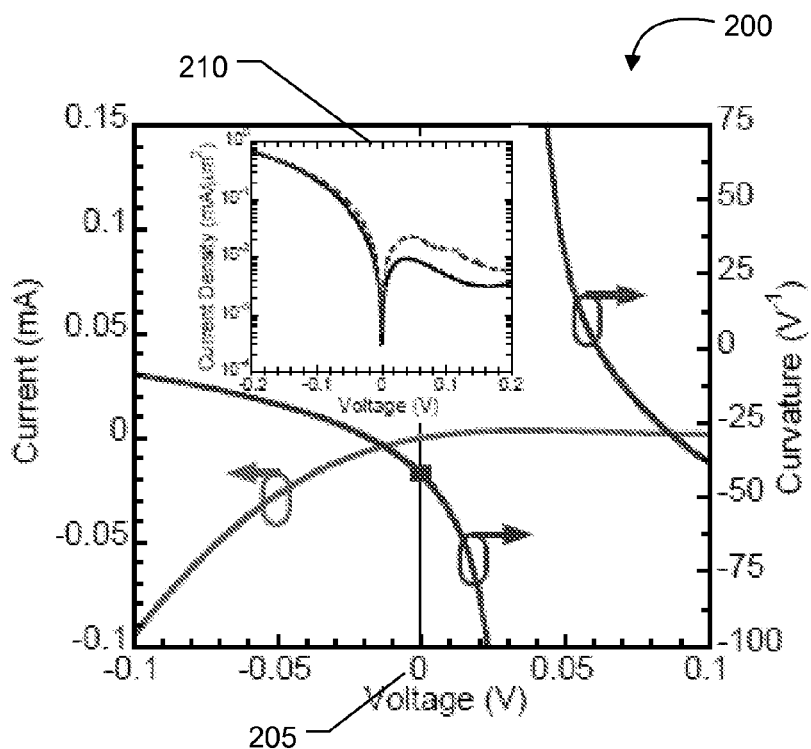
FIG. 2A is an example plot of current-voltage and curvature characteristics for an example detector that may utilize the example heterostructure layer of FIG. 1.

FIG. 2A shows the measured current-voltage and curvature characteristics 200 for an example $0.85 \times 0.85$ $\mu m^2$ area device, such as the example device 100 shown in FIG. 1. In the illustrated example of FIG. 2A, at zero bias 205, a junction resistance, $R_j$, of 3239 n and a high curvature of 42.4 V$^{-1}$ are measured. Current density-voltage characteristics of a detector with the $\delta$-doping plane and that of a device on an identical heterostructure except with uniform cathode doping are compared in an inset 210 of FIG. 2A. The example inset 210 of FIG. 2A is expanded in FIG. 2B, which illustrates a current-voltage comparison between an Sb heterostructure having a 10 Å tunnel barrier 220 (see dash-dot line), an Sb heterostructure having a 7 Å tunnel barrier 222 (see dashed line), and an Sb heterostructure having a 7 Å tunnel barrier with $\delta$-doping 224 (see solid line). As can be seen with $\delta$-doping 224 (solid line), the example forward current (electrons tunneling from n-InAs (e.g., the spacer layer 112 of FIG. 1) to the undoped $Al_{0.1}Ga_{0.9}Sb$ layer (e.g., the undoped layer 108 of FIG. 1)) for the δ-doped heterostructure (e.g., a detector) is strongly suppressed, while the backward current remains almost unchanged, resulting in an improved zero bias curvature. In operation, the example non-uniformly doped (e.g., δ-doped) plane 114 and Sb tunnel barrier 110 improve device curvature by increasing the ratio of current on either side of the zero bias point 205.

Figure 3:
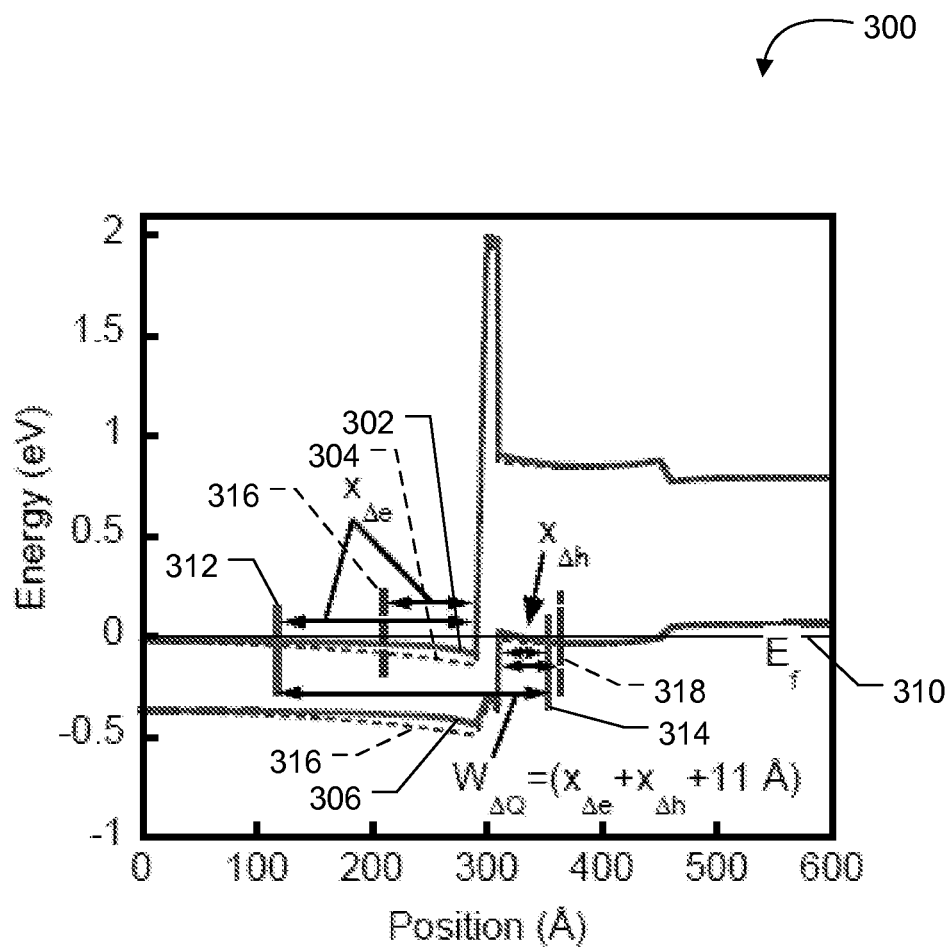
FIG. 3 illustrates energy band diagrams for two example detector heterostructure designs.

FIG. 3 shows computed energy band diagrams 300 for a uniformly-doped detector 304, 316 (dashed-lines) and a non-uniformly doped detector 302, 306 (solid lines) heterostructures. In the illustrated example of FIG. 3, a top-most solid line 302 represents the conduction band of the non-uniformly doped (i.e., δ-doped) heterostructure, and a top-most dashed line 304 represents the conduction band of the uniformly doped heterostructure. Also shown in the illustrated example of FIG. 3, a lower-most solid line 306 represents the valence band of the non-uniformly doped heterostructure, and a bottom-most dashed line 308 represents the valence band of the uniformly doped heterostructure. As can be seen in the example of FIG. 3, the addition of a fully-depleted p-type δ-doping plane 114 reduces the band bending in the InAs cathode at an edge of the tunnel barrier 110, and brings the conduction band of the InAs close to the Fermi level $E_f$ 310. For tunnel diodes, this change in band alignment more strongly suppresses the forward current flow than the backward current, thereby promoting an improved curvature coefficient.

$$\beta_V = 2Z_S\gamma \quad \text{Equation 3.}$$

As shown in the example Equation 3, device 100 sensitivity also improves because sensitivity ($\beta_V$) is approximately directly proportional to the improved curvature coefficient ($\gamma$), within typical approximations of an operational frequency well below the cutoff frequency of the detector.

Figure 4A:
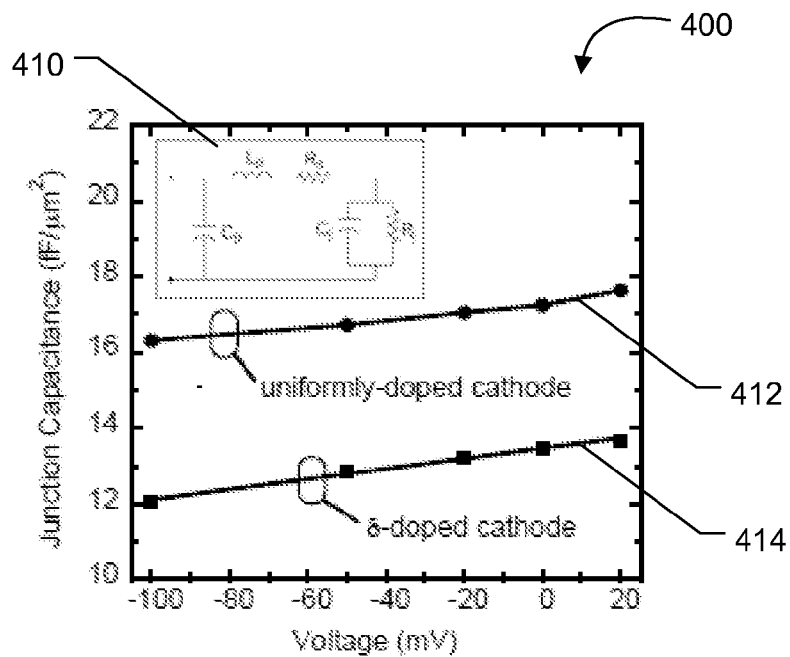
FIG. 4A illustrates junction capacitance versus voltage plots for example cathode designs.
Figure 4B:
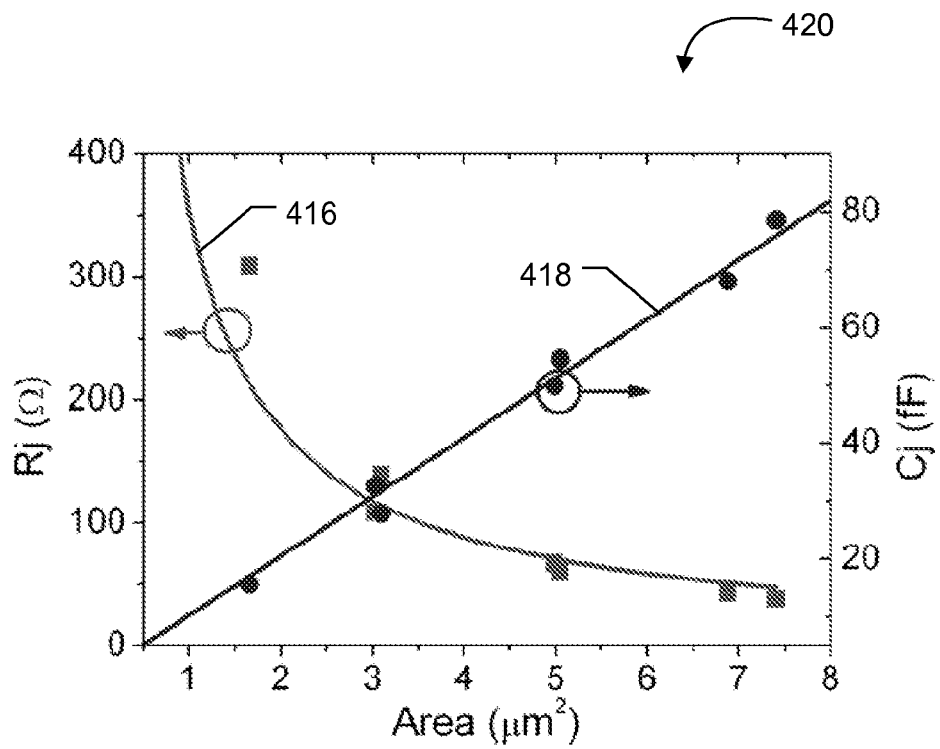
FIG. 4B illustrates junction capacitance versus area and junction resistance versus area plots for a 7 Å heterostructure.

In addition to the improvement in sensitivity ($\beta_V$), a lower junction capacitance, $C_j$, may also be realized through the inclusion of the non-uniform doping plane 114, such as a δ-doping plane, in the example cathode substructure 122. A junction capacitance versus bias chart 400 is shown in FIG. 4A, which was extracted from example bias-dependent on-wafer s-parameter measurements. In the illustrated example of FIG. 4A, the junction capacitance ($C_j$) of a uniformly doped device 412 and/or a non-uniformly doped device 414 (e.g., a δ-doped device) depends approximately linearly on (a) the applied bias for a given heterostructure, and (b) the specific capacitance for the given heterostructure. FIG. 4A illustrates, in part, that the example δ-doped detector 414 at zero bias is, in one example, 13 fF/μm², which is approximately 25% lower than that of devices without δ-doping in the cathode. The p-type δ-doping facilitates, in part, a lower capacitance by reducing the accumulation of electrons adjacent to the AlSb barrier 110 in the InAs cathode 116. Such effects of the p-type δ-doping are also evident via the example band diagrams 300 of FIG. 3, in which vertical lines denote computed centroids of incremental charges for a small changes in applied bias. FIG. 4B illustrates junction resistance ($R_j$, see trace 416) and junction capacitance ($C_j$, see trace 418) data extracted from on-wafer s-parameter measurements as a function of device area 420.

Returning briefly to FIG. 3, a left-most solid vertical line 312 represents the centroid of incremental electron distribution for the example δ-doped structure, and a right-most solid vertical line 314 represents the centroid of incremental hole distribution for the example δ-doped structure. On the other hand, a left-most dashed vertical line 316 represents the centroid of incremental electron distribution for an example uniformly doped structure, and a right-most dashed vertical line 318 represents the centroid of incremental hole distribution for the example uniformly doped structure. As shown by comparing the example δ-doped structure centroids (312 and 314) with the example uniformly doped structure centroids (316 and 318), the example δ-doped structure exhibits a larger spacing between hole and electron charge centroids ($W_{AQ}$). As a result, a lower capacitance is realized when employing the δ-doped structure as compared to the uniformly-doped structure. Self-consistent Poisson/Schrodinger calculations suggest that the δ-doping plane may increase the electron-hole separation from, in one example, 153 Å to 239 Å, for a reduction in capacitance of approximately 39%, which is in reasonable agreement with the measured capacitance change. Reduced capacitance may improve the intrinsic cutoff frequency, $f_c = 1/(2\pi R_S C_j)$, and also reduce a reactive component of the example detector impedance and ease the realization of broadband matching. In this expression, $R_S$ is the series resistance of the device, which is primarily limited by contact resistance. For δ-doped devices, an example $R_S$ of 26Ω may be realized, which results in an $f_c$=620 GHz, which represents an example rather than a limitation. In other words, further improvements in such contact resistances are possible. A comparison of key figures of merit for uniformly-doped and δ-doped structures with 10 Å thick tunnel barriers as an example is shown below in Table 1.

TABLE 1

| Device Type | $\gamma$ (V$^{-1}$) | $\beta_v$ (V/W) | $C_j$ (fF/μm²) | $R_j$ (Ω μm²) | NEP (pW/Hz$^{1/2}$) |
|---|---|---|---|---|---|
| δ-Doped Cathode | 42.4 | 4200 | 13 | 2340 | 0.24 |
| Uniform Cathode | 32 | 3220 | 17.2 | 1340 | 0.29 |

As shown in Table 1, the junction resistance of the example δ-doped structure is increased from 1230 Ωμm² to 2340 Ωμm². While this increase in $R_j$ leads to increased thermal noise, the overall detector NEP is improved because the increase in $\beta_v$ more than offsets the increased thermal noise.

Figure 5:
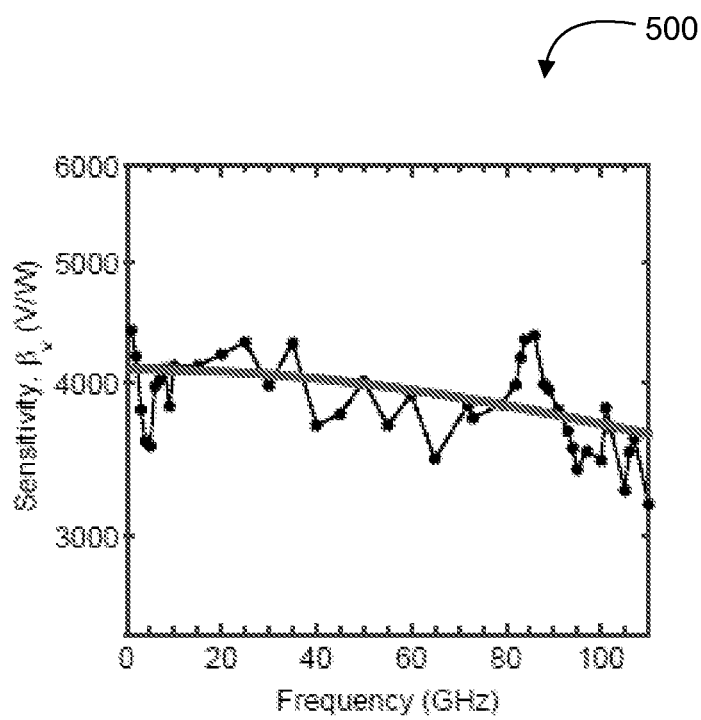
FIG. 5 illustrates a plot of on-wafer sensitivity versus frequency for the example detector.

The millimeter-wave performance of δ-doped detectors is also assessed, as described in further detail below. FIG. 5 shows a measured on-wafer voltage sensitivity graph 500 for the example detector driven by a 50 ΩRF source from 1 to 110 GHz. The example source was coupled to the device through a coaxial bias tee and on-wafer probes, and the detector voltage was measured at a DC arm of the bias tee. In the illustrated example of FIG. 5, the low frequency voltage sensitivity, $\beta_v$, is 4200 V/W, which is an improvement of approximately 31% from the previously-reported 3200 V/W for an identical device except with uniformly-doped cathode. An example nonlinear device model was extracted using bias-dependent s-parameter measurements and the example circuit model shown in the inset (410) of FIG. 4. In this example model, the series inductance, pad capacitance, and series resistance are bias independent, while the junction resistance and capacitance vary with bias. The parameters were found using nonlinear least-squares optimization of the circuit model to the measured s-parameters, with an additional constraint that the junction and series resistances were related to the measured DC I-V characteristics through example Equation 4, shown below.

$$\frac{\partial I}{\partial V} = \frac{1}{(R_S + R_j)}.$$ Equation 4

Based on, in part, the aforementioned least-squares optimization of the circuit model, a $C_p$ of 12 fF, $L_p$ of 65 pH, and $R_S$ of 26Ω were extracted, and the junction capacitance ($C_j$) is shown in FIG. 4. The frequency-dependence of the sensitivity predicted using the extracted nonlinear model agrees well with the measured sensitivity, as shown in FIG. 5. Extrapolation of the example circuit model projects an unmatched sensitivity of 2000 V/W at 400 GHz. This experimental study of the frequency response shows the potential of Sb-heterostructure diodes as detectors at W band through Y-band and beyond.

The optimum sensitivity, $\beta_{opt}$, that may result from the inclusion of a lossless matching network between the source and detector was projected from the measured unmatched sensitivity with an example 50-Ω source in conjunction with the measured s-parameters. The low-frequency $\beta_{opt}$ with an example conjugately matched source is calculated to be, in this example, $8.0 \times 10^4$ V/W, and is $3.0 \times 10^4$ V/W at 94 GHz. In view of these example devices experimentally showing thermal-noise limitations for small incident powers, the corresponding noise equivalent power for the detector operated at 94 GHz is estimated to be 0.24 pW/Hz$^{1/2}$ based on the measured junction resistance. This is an improvement of approximately 17% over the NEP of a typical uniformly doped cathode device. The combination of high sensitivity and low noise makes the example Sb-heterostructure detectors described herein promising for passive millimeter-wave imaging sensors without RF pre-amplification.

Figure 2B:
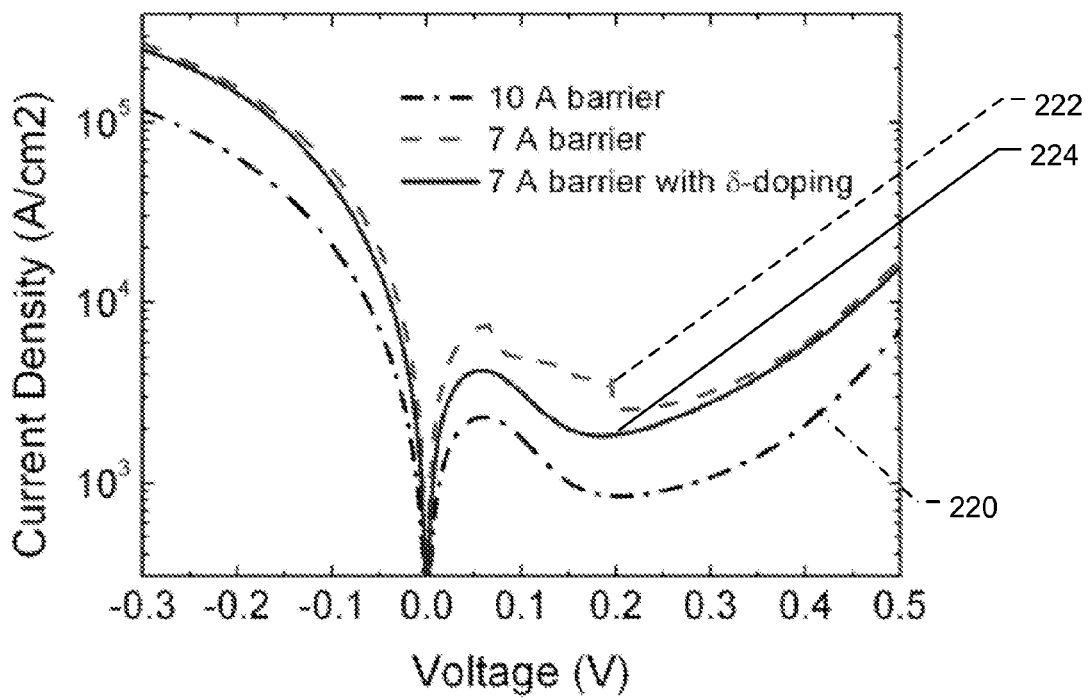
FIG. 2B is an example plot of current density versus voltage for three example heterostructure designs.

Table 2 illustrates additional example figures of merit for the three example heterostructures shown in FIG. 2B, in which noise equivalent temperature difference (NETD) values are calculated for matched sensitivity with an ideal bandpass lossless matching network at 94 GHz. These are example data from fabricated devices and do not imply fundamental limitations, but do illustrate example observed trends.

TABLE 2

| Structure | 10 Å | 7 Å | 7 Å with δ-doping |
|---|---|---|---|
| Relative γ (%) | 100 | 88 | 100 |
| $R_j$ (Ω · μm$^2$) | 1045 | 353 | 369 |
| $C_j$ (fF/μm$^2$) | 8.5 | 10.5 | 9.5 |
| $R_s$ (Ω · μm$^2$) | 22 | 28 | 23 |
| $f_T$ (GHz) | 852 | 541 | 729 |
| NETD (K) | 7.14 | 3.51 | 3.24 |
| RL = 16 dB | | | |
| $\Delta f_{rf}$ (GHz) | 30 | 71 | 75 |

As illustrated by Table 2, implementation of the non-uniform doping, such as δ-doping, with an Sb tunnel barrier breaks previous tightly linked trade-offs between junction resistance ($R_j$) and curvature (γ). In Table 2, for ease of comparison, the curvature (γ) has been normalized to the value obtained for the 10 Å barrier devices. By introducing the δ-doping, curvatures are improved while maintaining lower values of $R_j$.

Example InAs/AlSb/GaSb backward diode detectors with an improved heterostructure design have shown a high curvature of 42.4 V$^{-1}$ and reduced capacitance. This corresponds to an unmatched sensitivity of 4200 V/W, exceeding the theoretical limits of Schottky diodes. The improved sensitivity and decreased junction capacitance for the example detectors described herein originate from the example modified device heterostructure, which incorporates a fully-depleted p-type δ-doping plane with sheet concentration of $1 \times 10^{12}$ cm$^{-2}$ in the n-InAs cathode layer. The high sensitivity and low junction resistance result in an estimated NEP of 0.24 pW/Hz$^{1/2}$ at 94 GHz for a conjugately-matched source, making it a promising candidate for passive imaging sensors at room temperature without RF pre-amplification. Moreover, example detectors with this heterostructure have reduced junction capacitance that offers the potential for operation through Y band and beyond.

Although certain example methods and apparatus have been described herein, the scope of coverage of this patent is not limited thereto. On the contrary, this patent covers all methods and apparatus fairly falling within the scope of the appended claims either literally or under the doctrine of equivalents.

What is claimed is:

1. A backward diode, comprising:
    a cathode layer adjacent to a first side of a p-type δ-doping plane or a p-type layer having a non-uniform doping profile;
    a spacer layer having a first side adjacent to a second side of the p-type δ-doping plane or of said p-type layer having a non-uniform doping profile;
    a tunnel barrier adjacent to a second side of the spacer layer;
    a p-doped anode layer; and
    an undoped layer in between the tunnel barrier and the anode layer.

2. A backward diode as defined in claim 1, wherein the tunnel barrier comprises a thickness between 0.3 and 3 nm.

3. A backward diode as defined in claim 2, wherein the tunnel barrier is undoped.

4. A backward diode as defined in claim 1, wherein the δ-doping plane or the p-type layer comprises a Beryllium dopant.

5. A backward diode as defined in claim 4, wherein the Beryllium dopant concentration is at least $5 \times 10^{+11}$ cm$^{-2}$.

6. A backward diode as defined in claim 1, wherein the non-uniform doping profile is a side of the p-type layer closest the cathode layer.

* * * * *